Figure 1:
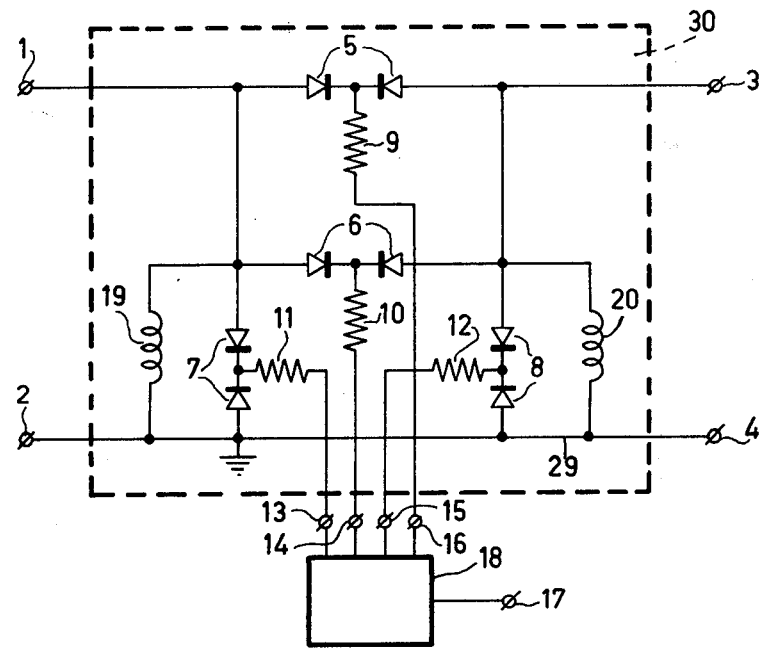

United States Patent [19]

Ludikhuize

[11] 4,047,131
[45] Sept. 6, 1977

[54] VOLTAGE-CONTROLLED HF-SIGNAL ATTENUATOR

[75] Inventor: Adrianus Willem Ludikhuize, Eindhoven, Netherlands

[73] Assignee: U.S. Philips Corporation, New York, N.Y.

[21] Appl. No.: 688,534

[22] Filed: May 21, 1976

[30] Foreign Application Priority Data

May 28, 1975 Netherlands ................ 7506265

[51] Int. Cl.² ......................................... H03H 7/24
[52] U.S. Cl. .................................. 333/81 R; 307/264
[58] Field of Search ........................... 323/66, 74, 80; 333/81 R, 81 A; 307/264

[56] References Cited

U.S. PATENT DOCUMENTS 3,337,749  8/1967  Lee et al. ............... 333/81 R X
3,453,564  7/1969  Russell ....................... 333/81 R Primary Examiner—Paul L. Gensler
Attorney, Agent, or Firm—Frank R. Trifari; Henry I. Steckler

[57] ABSTRACT

An integrated voltage-controllable RF-signal attenuator having a pair of signal input terminals and a pair of signal output terminals, comprising a first signal transmission path connected between a signal input terminal and a signal output terminal, which attenuator includes a first pair of PIN-diodes which are arranged in series opposition and which have a RF-signal impedance which is variable by passing a variable forward bias current through them, and a signal discharge path connected between the signal input terminals, said discharge path comprising a second pair of PIN-diodes arranged in series opposition, which attenuator also includes a special circuit of pairs of PIN-diodes, arranged in series opposition, by means of which the distortions can be kept lower within the normal attenuation range than is possible with the known attenuators which are provided with the same pairs of PIN-diodes, arranged in series opposition.

4 Claims, 5 Drawing Figures

VOLTAGE-CONTROLLED HF-SIGNAL ATTENUATOR

The invention relates to an integrated voltage-controllable RF-signal attenuator having a pair of signal input terminals and a pair of signal output terminals, a signal transmission path connected between a said signal input terminal and a said signal output terminal, which transmission path includes a first pair of PIN diodes, arranged in series opposition with a RF-signal impedance which depends on a first variable direct current as well as a signal discharge path connected between the signal input terminals, which discharge path includes a pair of PIN diodes arranged in series opposition.

Such an integrated voltage-controllable attenuator is known from U.S. Pat. application Ser. No. 725,781, filed on Sept. 23, 1976, which as an effective U.S. filing date of Nov. 1, 1973. It may be used in an automatic gain control circuit of a VHF or UHF receiver, in which application it may be connected with a fixed gain amplifier.

In the known attenuator three pairs of PIN diodes each arranged in series opposition are arranged in a $\pi$ configuration. As indicated in the preamble, these pairs of PIN diodes, are used as variable impedance elements. The signal attenuation can be increased by increasing the impedance of the series branch, that is to say the signal transmission path between the signal input terminal and the corresponding signal output terminal and decreasing the impedance of the shunting branches, that is to say the signal discharge path across the pair of input terminals and that across the pair of output terminals.

If a pair of PIN diodes arranged in series opposition is constructed in integrated form, it is found that its performance is liable to be unsatisfactory when used in the known attenuator, as it is liable to adversely affect the minimum signal attenuation obtainable and/or the distortion produced, with the result that either the minimum attenuation or the distortion or both are liable to become impermissibly large for practical applications. It appears that in attenuators which utilise discrete PIN diodes this disadvantage occurs to a much lesser degree. With discrete PIN diodes there is more freedom in the choice of the geometrical form and the construction of the diodes and the position of the different doping regions relative to one another. This allows a much lower minimum attenuation and distortion to be achieveed therewith than with the integrated PIN diodes. Therefore, discrete PIN diodes will yield better results in conventional attenuator circuits, such as, for example, described in the article "Kanalwahler-Vorstufen mit PIN-Dioden Regelung" published in "VALVO Brief" of November 27, 1972, than integrated PIN diodes in comparable attenuator circuits.

It is an object of the invention to provide a new integrated voltage-controllable attenuator circuit of the kind mentioned in the preamble, which distorts the HF-signal to a much lesser degree and with which a much lower minimum attenuation can be achieved than is possible with the known attenuator circuits which utilise pairs of integrated PIN-diodes.

It is in particular an object of the invention to enable the realisation of easily reproducible, integrated voltage-controllable attenuators which satisfy the present quality requirements as regards the minimum attenuation and the degree of distortion.

An integrated voltage-controllable HF signal attenuator of the type according to the invention, described in the preamble is characterized in that connected parallel to said first signal transmission path there is a second signal transmission path which includes a third pair of PIN diodes, arranged in series opposition, whose HF-signal impedance depends on a second variable direct current, in that the minimum signal impedance of the first transmission path within the control range is smaller than that of the second signal transmission path and in that at an increasing attenuation of said signal attenuator the second voltage-controlled direct current decreases in magnitude after the first.

The invention is based on the recognition that by means of a proper impedance control of the two parallel signal transmission paths and the signal discharge path a signal distribution between said paths can be achieved, such that the distortion peaks during passing through the attenuation control range are mainly produced alternatingly by one of the said paths, whilst the magnitude of each distortion peak is kept within reasonable bounds by arranging that a suitable ratio always exists between the signal current and the direct current which flows through each pair of PIN diodes of that transmission path which is making the most contribution to the distortion. From the article "Semi-conductor gain control techniques" by J. S. Brown, published in "Proceedings of the National Electronics Conference", volume 16, 1960, pages 541–548 a voltage-controlled attenuator, having discrete p-n-diodes is known, in which two parallel signal transmission paths are provided. One path includes a silicon diode and the other includes a series arrangement of a resistor and a germanium diode. Because the minimum voltage at which the silicon diode conducts (the threshold voltage thereof) exceeds the threshold voltage of the germanium diode, the control voltage of the germanium diode is also here decreasing in magnitude at an increasing attenuation after that of the silicon diode. However, for the functioning of that attenuator it is essential that the threshold voltages of the two diodes differ, to such an extent that the diode which is connected in series with the resistor must have a lower threshold voltage than the other diode. This means that the two diodes must be produced of different semi-conductor materials, so that such an attenuator cannot be constructed in monolythic integrated form, in contradistinction to the attenuator according to the invention.

In practice the PIN diodes which have a relatively low minimum insertion loss appear to distort much more than the PIN diode having a higher minimum insertion loss.

By having the properties of the attenuator at small attenuations mainly determined by one or more pairs of PIN diodes of the type having a low minimum insertion loss (producing in practice considerable distortion at low values of the control current) the minimum insertion loss of the attenuator becomes low, whilst the distortions in this range of small attenuations are permissible small because of the small signal-control current rate of the currents passing these diodes.

By having, in the case of large attenuations, the properties of the attenuator mainly depend on one or more pairs of PIN diodes of the type having a low distortion and — in practice — a high minimum insertion loss the distortion of the attenuator at these large attenuations becomes low, whilst a high minimum insertion loss in this attenuation range is not relevant.

A preferred embodiment of an attenuator according to the invention is therefore characterized in that the minimum HF signal impedance of the first pair of PIN diodes, which are arranged in series opposition, is smaller within the control range of the said HF signal attenuator than the minimum HF signal impedance of the third pair of PIN diodes, arranged in series opposition.

It will often be feasible to vary the impedance of the discharge path existing between the attenuator input terminals to assist in varying the attenuation of the circuit. However, it will often be required, that the signal input impedance of the attenuator should not exceed a certain limit whatever the attenuation setting within the control range, inter alia to avoid an impermissibly high signal reflection from occurring. Consequently the pair of PIN diodes in the signal discharge path can only be used for a limited part of its impedance range for controlling the attenuation.

This drawback can be obviated by means of a second preferred embodiment of an attenuator according to the invention which is characterized in that the second signal transmission path and the signal discharge path comprise a common resistor. An important advantage of this measure is also that the latter resistor linearizes to a considerable degree the third pair of PIN diodes, and furthermore, at a suitably chosen value, also attends to a correct signal current distribution between the two parallel signal transmission paths and the signal discharge path.

The use of PIN-diodes having a relatively high minimum insertion loss for the PIN diodes in the signal discharge path and the use of PIN diodes having a large distortion for the third pair of PIN diodes, which are arranged in series opposition, is enabled by means of a third preferred embodiment of an attenuator according to the invention, which is characterized in that the second signal transmission path also comprises the second pair of PIN diodes which are arranged in series opposition, whilst the signal discharge path comprises a second resistor.

Figure 2:
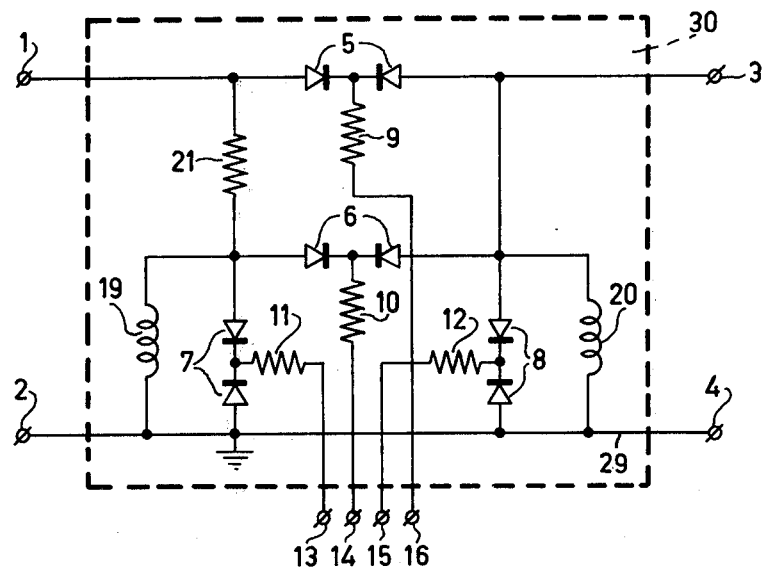
Figure 3:
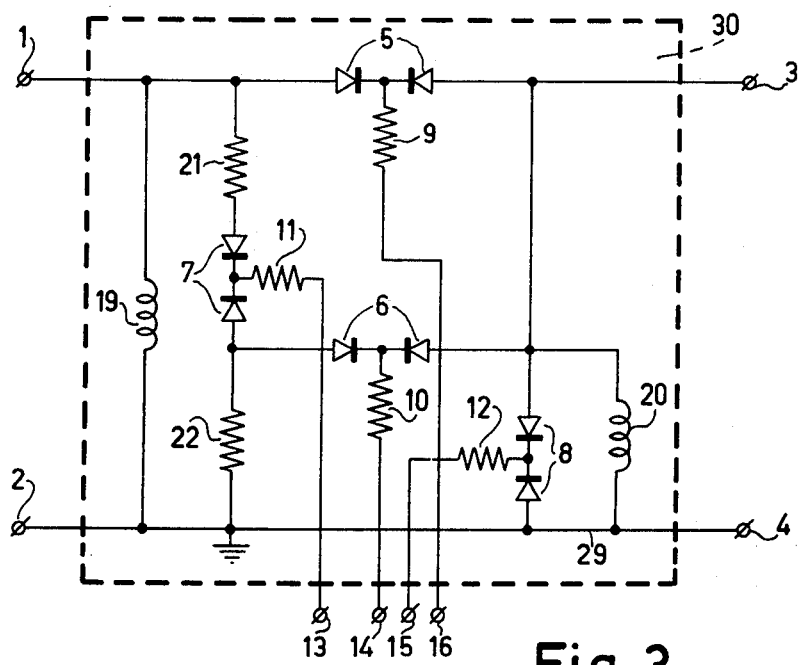
Figure 5:
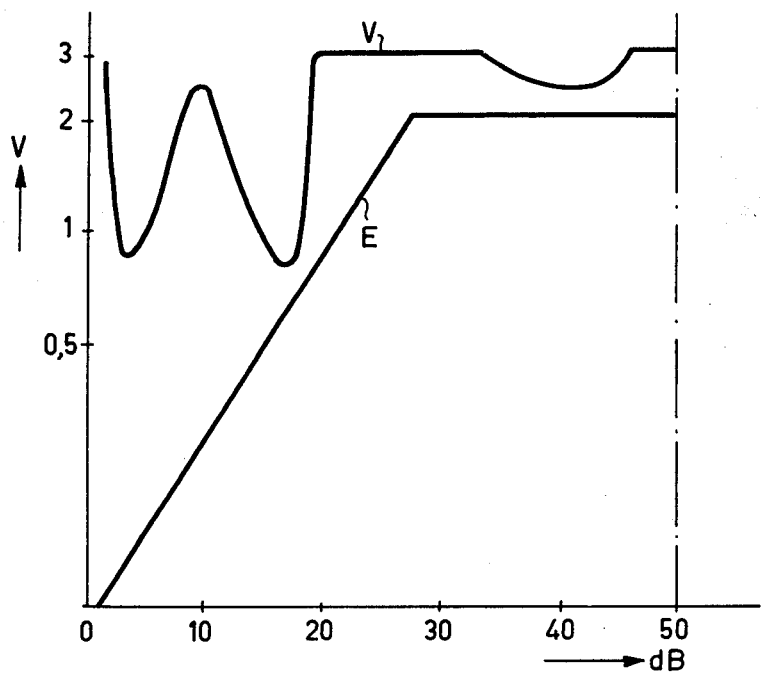
Figure 4:
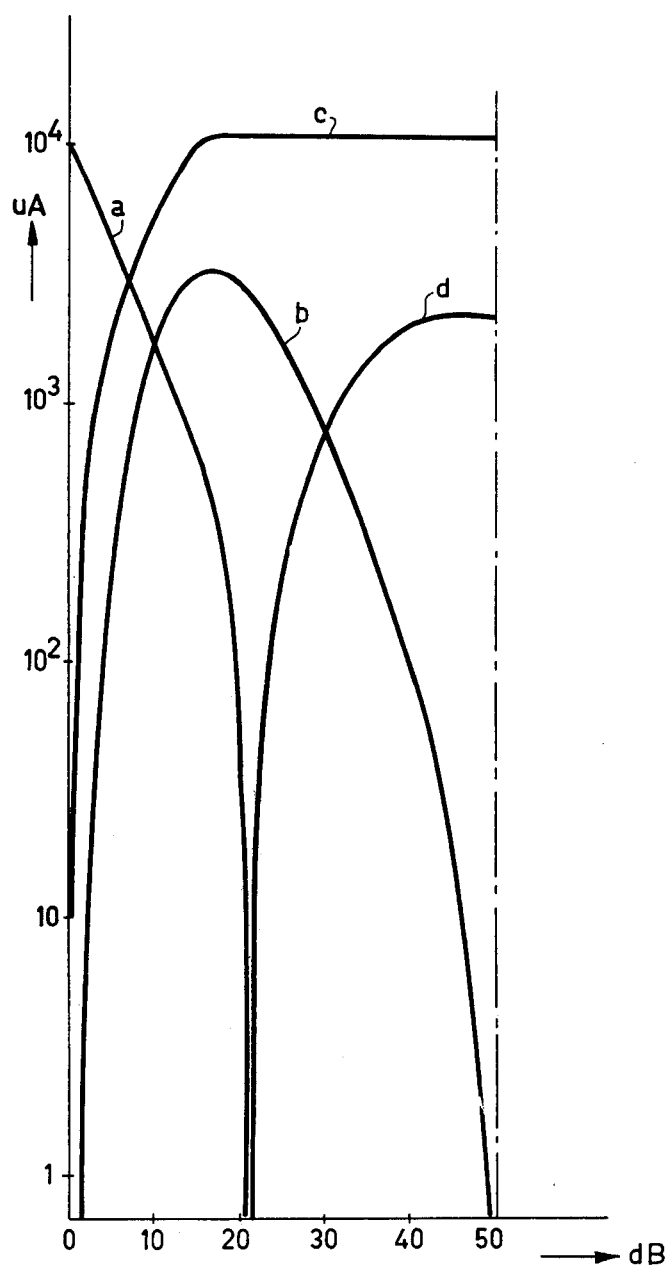

Embodiments of the invention will now be described, by way of example with reference to the accompanying diagrammatic drawing, in which FIG. 1 shows a first embodiment provided with a control unit, FIG. 2 shows a second embodiment, FIG. 3 shows a third embodiment, FIG. 4 is a graph which shows the desired variation in the diode control currents as a function of the attenuation for an attenuator of the embodiment of FIG. 3, and FIG. 5 is a graph, which shows the variation in the distortion and the permissible distortion as a function of the attenuation for an attenuator of last said embodiment.

FIG. 1 show an RF attenuator 30 having a pair of signal input terminals 1, 2, a pair of signal output terminals 3, 4 and control input terminals 13, 14, 15 and 16, as well as a control unit 18 having a control input 17, whose control outputs are connected to the control input terminals 13, 14, 15 and 16 of the attenuator 30.

The terminal 1 is connected to the terminal 3 through a parallel arrangement of a first pair of PIN diodes 5, arranged in series opposition and a third pair of PIN diodes 6, connected in the same manner. This parallel arrangement is on the one hand connected to a ground wire through a second pair of PIN diodes 7, arranged in series opposition, and also through an inductance 19 and on the other hand through a fourth pair of PIN diodes 8, arranged in series opposition, and through a parallel inductance 20 to the ground wire. The ground wire interconnects the terminals 2 and 4 and connects them to ground.

The cathodes of the pairs of diodes 5, or 6, 7 and 8 are connected to the control input terminals 16, 14, 13 and 15 respectively through supply resistors 9, 10, 11 and 12 respectively.

An HF signal offered to the signal input terminal 1 can be attenuated by having the impedance of the parallel arrangement of the pairs of PIN diodes 5 and 6 increase and the impedance of the pair of diodes 7 and/or that of the pair of diodes 8 decrease. As is known, the impedance of a PIN diode can be controlled by varying a direct current which flows through it in the pass direction. As is also known, the distortion produced by an HF signal which passes through the diode may become very large especially at small direct currents, which correspond to high impedance values of the diode in question. When the diode is blocked it behaves substantially as a capacitance and then hardly introduces any distortion. If the direct current is large with respect to the signal current amplitude, the distortion is low, which in general corresponds to low impedance values.

The variable direct currents required for the impedance control of the pairs of diodes are supplied by the control unit 18 to whose terminal 17 a control signal is supplied, in general derived from an AVC voltage producing circuit (not shown).

The actual construction of this control unit will not be discussed, the attention is limited to the variation required in the variable direct currents at its output terminals as a function of the attenuation.

The variable direct currents intended for the pairs of diodes 5, 6, 7 and 8 respectively are supplied through the terminals 16, 14, 13 and 15, respectively and the supply resistors 9, 10, 11 and 12 respectively. The anodes of the diodes of each pair are all DC connected to ground, either directly or through the inductance 19 or 20.

The diodes of the first pair 5 are of a type having a relatively low minimum insertion loss, which type as mentioned above, normally produces considerable distortion when operated at high impedance values, the diodes of the third pair 6 are, on the other hand, of a type having a high miminum insertion loss which type normally produces only a small amount of distortion when operated at high impedance values.

By means of a proper impedance control of the pairs of diodes at any attenuation value within the control range a ratio is obtained in each pair of diodes between the signal current amplitude and the magnitude of the direct current therein which is such that the distortion produced by the attenuator is prevented from becoming too large.

A large curve (an example of the permissible limit which may be applicable in a given case) is plotted as curve E in FIG. 5, as a function of the attenuation in the attenuation control range, by means of a so-called target curve.

The above-mentioned diode-impedance control proceeds as follows: the lowest attenuation is obtained when the pair of diodes 5 conducts and the other pairs of diodes 6, 7 and 8 are blocked. This lowest value of the attenuation is then mainly determined by the minimum insertion loss of the pair of diodes 5, it will be evident why a type has been chosen for this pair of diodes which has a low minimum insertion loss.

An increasing attenuation is obtained by increasing the impedance of the pair of diodes 5 (by decreasing the direct current supplied through the control terminal 16). At the same time the signal input impedance of the attenuator at the terminals 1 and 2 is kept within those values thereof which are permissible in view of the input matching, by simutaneously adjusting the control current through the pair of diodes 7. This causes a large and noticeable amount of distortion. However, such distortion is normally permissible at those small attenuation values. Because, in practice, the input impedance can normally be allowed to vary between one and three times the characeristic impedance, the attenuation can be adjusted in part by means of this pair of diodes 7.

Whilst the direct current supplied to the pair of diodes 5 is being reduced, direct current is being supplied to the pair of diodes 6 through the terminal 14. As a result this pair of diodes 6 produces pronounced distortion. However, the signal current through the pair of diodes 5 is considerably larger than that through the pair of diodes 6, so that the distortion which is introduced by the latter pair of diodes, is hardly noticeable.

To increase the attenuation still further the control current through the pair of diodes 5 is decreased still further, whilst the control current through the pair of diodes 6 is increased. When the control current through the pair of diodes 5 has decreased so far that this pair of diodes introduces pronounced distortion the impedance of the pair of diodes 6 will have fallen so far that at this moment a signal current distribution is obtained between both pairs of diodes 5 and 6 connected in parallel, which is such that the distortion which is then produced (which is mainly introduced by the pair of diodes 5) remains within the permissible limits. The signal current then flows mainly through the substantially non-distorting pair of diodes 6. When the control current supplied to the pair of diodes 5 is decreased still further, this pair of diodes becomes blocked.

Thereafter the attenuation can be increased still further by decreasing the impedance of the pair of diodes 7 still further, that is to say by increasing the control current supplied to this pair of diodes still further until the lower limit of the permissible input impedance of the attenuator at the terminals 1 and 2 has been reached. If thereafter the impedance of the pair of diodes 6 is increased again and that of the pair of diodes 8 is decreased further attenuation will be obtained. At high impedance values of the pair of diodes 6 this pair produces a distortion. The distortion of the entire attenuator is then mainly determined by this pair of diodes 6, which is a reason to choose for this latter pair of diodes a type having a low maximum distortion. In practice this type shows indeed a high minimum insertion loss but at these high attenuations this property is not relevant.

FIG. 2 shows an attenuator in which the elements which correspond with the elements of the attenuator of the preceding FIG. 1 are indicated by means of the same reference numerals.

The most important difference between the attenuators of FIGS. 1 and 2 is the resistor 21, which is present in FIG. 2 and is connected between the terminal 1 and the common node of the pairs of diodes 6 and 7. This resistor 21 mainly linearizes the pair of diodes 7 so that the distortion introduced by this pair of diode 7 is decreased. Furthermore, this resistor ensures that less signal current flow through the pair of diodes 6, and allows more direct current to be supplied to the pair of diodes 7 than was the case with the attenuator of FIG. 1. If the value of the latter resistor 21 is suitably chosen a favourable ratio can be obtained between the signal current and the direct current amplitudes through the pairs of diodes 5, 6 and 7 which is such that the distortion produced by the attenuator can be kept within the limit which may be permitted. This enables one to use approximately the same type of diode for the pairs of diodes 5 and 6, so having approximately the same maximum distortion and minimum insertion loss, and allows at the same time the pair of diodes 7 to be utilised over a larger range of attenuation values.

The variation in the impedances of the pairs of diodes 5, 6, 7 and 8 during an increasing attenuation corresponds with the variation already described in the description of FIG. 1.

FIG. 3 shows an attenuator in which those components which correspond with the components of the attenuator of FIG. 2 have been given the same reference numerals.

The most important difference between the attenuators of FIGS. 2 and 3 is that in FIG. 3 the resistor 21 and the pair of diodes 7 are, in addition to being included in the signal discharge path between the terminals 1 and 2, also both included in the second signal transmission path through the pair of diodes 6, a resistor 22 being connected between the common node of the pairs of diodes 6 and 7 and ground. So now the signal discharge path between the terminals 1 and 2 comprises the resistor 21, the pair of diodes 7 and the resistor 22.

At a proper choice of the resistors 21 and 22 a favourable signal current distribution between the pairs of diodes 5, 6 and 7 is obtained, as was the case of the preceding attenuator, whilst it is now possible to choose for the pair of diodes 7, as compared with the pair of diodes 7 of the preceding attenuator, a type having a higher minimum insertion loss. The type of diode of the diode pairs 5 and 6 may also be identical in this attenuator.

The variation in impedance of the pairs of diodes 5, 6, 7 and 8 during an increasing attenuation corresponds to the variation already described with reference to the attenuator of FIG. 1.

The d.c. control currents of this attenuator in the attenuation range are plotted in FIG. 4, the distortion properties of the attenuator of FIG. 3 being shown in FIG. 5 (curve V).

FIG. 4 shows graphically the relationship which may be required between the control currents $a$, $b$, $c$ and $d$ of the diode pairs 5, 6, 7 and 8 respectively of FIG. 3, and the attenuation of the circuit, over an attenuation range of 0 to 50 dB. The magnitudes of the control currents are plotted along the vertical axis and are expressed in $\mu A$'s, the attenuation being plotted along the horizontical axis and expressed in numbers of dB.

In the range of small attenuation values the attenuation is mainly controlled with the pair of diodes 5, whose curve $a$ shows a strong decrease of the control current and with the pair of diodes 7 whose curve $c$ shows a strong increase of the control current at an increase of the attenuation. In the attenuation range where the pair of diodes 5 introduces pronounced distortion the control current through the pair of diodes 6 has increased so far that the impedance of this pair of diodes has become sufficiently small so that most of the signal current flows through them. In the attenuation range where the pair of diodes 5 is blocked, (at attenuations above approximately 20 dB) the control current through the pair of diodes 6 decreases, which is shown by curve b and the control current of the pair of diodes 8 increases which is indicated by curve d.

For the attenuators which are shown in the FIGS. 1 and 2, curve c is less steep and in such a way that the increase of this curve comes after that of curve b.

Curve V in FIG. 5 shows graphically the relationship between the degree of distortion and the attenuation in an attenuation range between 0 and 50 dB for the attenuator of FIG. 3.

Curve E in FIG. 5 represents the permissible distortion in this attenuation range.

Curve V shows the results of measurements made on one attenuator constructed as shown in FIG. 3, in which respect it should be noted that this curve is shown to give an impression where the largest distortions are produced at such an attenuator.

The measurements were made by supplying both a wanted signal and a noise signal to the attenuator, the frequencies of these signals being close to one another. Measurements were made at which amplitude of the noise signal an amplitude cross modulation in the order of magnitude of 1% was obtained. These noise signal amplitudes expressed in volts (e.m.f. effective), are plotted along the verical axis, the attenuation in dB having again been plotted along the horizontal axis. A reduction in the height of the curve signifies an increase in the distortion and vice versa.

A decrease in the distortion which would result in the graph in a measuring point about 3 V is shown as 3 V because the exact value of such a low distortion is irrelevant in the present context.

The first distortion peak, at approximately 4dB attenuation, is mainly produced by the pair of diodes 7 which have then passed from the blocked state into a state of high impedance. Thereafter, the distortion decreases, to start increasing again at an attenuation of approximately 10 dB. Because the pair of diodes 5 has become blocked the distortion has decreased at an attenuation of approximately 20 dB. A further attenuation is then mainly produced by the fact that the impedance of the pair of diodes 6 in creases, which, at first, introduces little distortion. If the impedance of the pair of diodes 6 increases substantially, then this pair of diodes will produce more distortion, which produces the third and last distortion peak (in the attenuation range around 40 dB).

The distortion curve V never crosses the target curve E in the attenuation range under consideration, in other words the distortion produced by this attenuator is always less than the maximum permissible, provided that the attenuation lies within the range of possible attenuation values which variable attenuators are normally required to cover.

Finally, the target curve E is of course partly determined by the distortion requirements which are imposed on other components with which the attenuator cooperates.

What is claimed is:

1. An integrated voltage controllable RF signal attenuator having a control range and a pair of signal input terminals and a pair of signal output terminals, said attenuator comprising a parallel arrangement of first and second signal transmission paths, both of said transmission paths being coupled between one of said signal input terminals and one of said output terminals; a signal shunting path coupled between the signal input terminals; said first transmission path comprising a first pair of PIN-diodes coupled in series opposition and having an RF impedance which depends on a first variable direct current; said signal shunting path comprising a second pair of PIN-diodes coupled in series opposition; and said second transmission path comprising a third pair of PIN-diodes coupled in series opposition and having an RF impedance which depends on a second variable direct current; the minimum signal impedance of the first transmission path being smaller than that of the second transmission path within the control range of the attenuator and the second variable direct current decreasing in magnitude after the first direct current decreases in magnitude for an increasing attenuation of the attenuator.

2. An integrated voltage-controllable RF signal attenuator as claimed in claim 1, wherein the minimum signal impedance of the first pair of pin diodes arranged in series opposition is smaller within the control range of said RF signal attenuator than the minimum signal impedance of the third pair of PIN-diodes arranged in series opposition within this control range.

3. An integrated voltage-controllable RF-signal attenuator as claimed in claim 1, wherein the second signal transmission path and said signal shunting path have a resistor in common.

4. An integrated voltage-controllable RF-signal attenuator as claimed in claim 3, wherein the second signal transmission path also comprises the second pair of PIN-diodes arranged in series opposition and the signal shunting path includes a second resistor.

* * * * *